(12) United States Patent
Matsutori et al.

(10) Patent No.: US 7,420,655 B2
(45) Date of Patent: *Sep. 2, 2008

(54) RETICLE-CARRYING CONTAINER

(75) Inventors: Chiaki Matsutori, Kikuchi (JP); Koichi Yanagihara, Kikuchi (JP)

(73) Assignee: Miraial Co., Ltd. (JP)

( * ) Notice: Subject to any disclaimer, the term of this patent is extended or adjusted under 35 U.S.C. 154(b) by 164 days.

This patent is subject to a terminal disclaimer.

(21) Appl. No.: 11/293,084

(22) Filed: Dec. 5, 2005

(65) Prior Publication Data

US 2006/0126052 A1    Jun. 15, 2006

(30) Foreign Application Priority Data

Dec. 14, 2004  (JP)  .............................. 2004-361885

(51) Int. Cl.
G03B 27/62 (2006.01)
G03B 27/58 (2006.01)
(52) U.S. Cl. .......................................... 355/75; 355/72
(58) Field of Classification Search .................. 355/75, 355/51, 72; 206/710, 454; 414/226.05; 29/464
See application file for complete search history.

(56) References Cited

U.S. PATENT DOCUMENTS 6,216,873 B1   4/2001  Fosnight et al. ............. 206/710
2003/0074097 A1   4/2003  Emerson et al. ............. 700/121
2003/0227605 A1  12/2003  del Puerto et al. ............. 355/51
2006/0076264 A1 *  4/2006  CletusWittman ............ 206/710

FOREIGN PATENT DOCUMENTS

| EP | 1 022 615 | 7/2000 |
| EP | 1 662 324 | 5/2006 |
| JP | A-10-163094 | 6/1998 |

* cited by examiner

Primary Examiner—Peter B Kim
(74) Attorney, Agent, or Firm—Bacon & Thomas, PLLC (57) ABSTRACT

The present invention allows a reticle-carrying container 11 to be fastened in a reticle stocker 2 even if the reticle-carrying container 11 is wrongly oriented. The reticle-carrying container 11 includes an interior with an opening at one end for storing a reticle 12, a door 14 for covering and blocking the opening, and a seal material 15 for sealing the interior hermetically when the door 14 closes the pod 13. The reticle-carrying container 11 is provided with two sets of kinematic pin grooves 61 for positioning and fastening the reticle-carrying container 11, which are turned 180 degrees from each other on the outer surface of the door 14. Receiving parts 22 for receiving and holding the kinematic pin grooves 61 are arranged in the positions corresponding to the kinematic pin grooves 61 on the outer surface of the pod 13 so that the two sets of kinematic pin grooves 61 can be engaged with the pins in both orientations.

3 Claims, 6 Drawing Sheets

Fig.7

RETICLE-CARRYING CONTAINER

CROSS-REFERENCE TO RELATED APPLICATION

This application claims, under 35 USC 119, priority of Japanese Application No. 2004-361885 filed Dec. 14, 2004.

BACKGROUND OF THE INVENTION

1. Field of the Invention

The present invention relates to a reticle-carrying container for storing a reticle, during transportation, used for a light exposure apparatus or the like that transfers a set pattern to a substrate.

2. Description of the Background Art

Semiconductor devices and liquid crystal display devices are manufactured in the process of photolithography. In this process, an image of a pattern formed on a reticle (including a photo mask) is projected and transferred by a light exposure apparatus onto a substrate such as a semiconductor wafer and glass plate. At that time, the projected pattern reacts with a photosensitive agent applied on the substrate, and then a circuit is formed through the subsequent operations.

During this process, a reticle is handled by storing in a dedicated reticle-carrying container in order to prevent contamination with dust, etc. and damage from contact with other components.

For making an intricate circuit, it is necessary to provide a large number of circuit patterns on the substrate. Accordingly, many reticles are prepared and many patterns are exposed in layers on the substrate.

Figure 2:
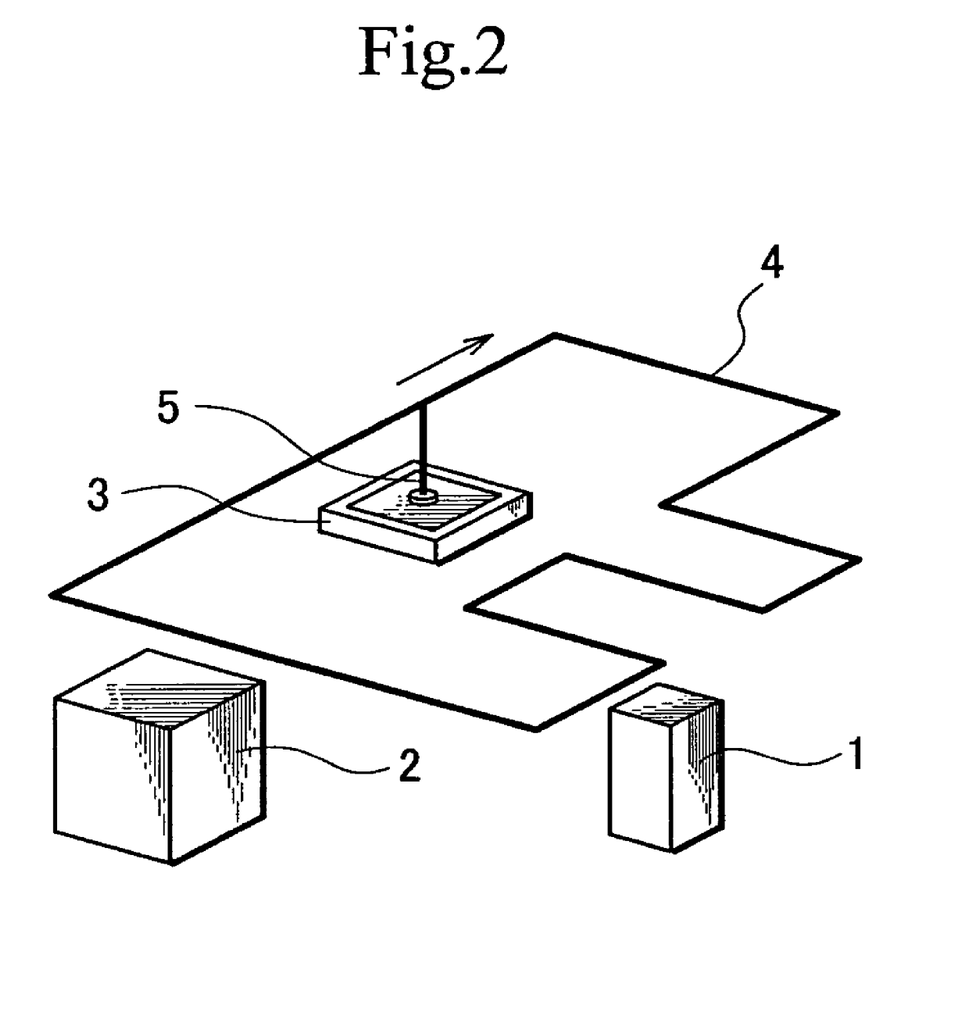
FIG. 2 is a schematic view showing one example of an apparatus used in a photolithography process.

FIG. 2 shows one example of an apparatus used in the photolithography process. In the figure, numeral 1 indicates a light exposure apparatus that projects and transfers a circuit pattern onto the substrate. A numeral 2 denotes a reticle stocker in which a large number of reticles are stored and retained. A numeral 3 indicates a reticle-carrying container which stores reticles. A numeral 4 indicates a transfer rail provided between a light exposure apparatus 1 and a reticle stocker 2, which transfers the reticles stored in a reticle-carrying container 3 between these two components. A numeral 5 indicates a transfer mechanism provided on the transfer rail 4, which holds and transfers directly the reticle-carrying container 3.

These components are controlled by a controller (not shown). With this, the reticles required for a circuit pattern stored in the reticle-carrying container 3 are transferred by the transfer mechanism 5 on the transfer rail 4 from the reticle stocker 2 to the light exposure apparatus 1. The reticles no longer required in the light exposure apparatus 1 are returned to the reticle stocker 2 by the transfer mechanism 5 on the transfer rail 4.

If the reticles used in the above described process are contaminated with dust, etc. or damaged by contact with other components, it is impossible to form an accurate circuit pattern. Therefore, for supporting the reticles safely and securely, the reticles are stored in the reticle-carrying containers 3.

One example of the reticle-carrying container 3 is shown in Japanese Patent Laid-Open No. 10-163094. The reticle supporting means set forth in Japanese Patent Laid-Open No. 10-163094 is a pin. As means for supporting a reticle from underneath, the reticle supporting pins are provided on the four corners of the reticle. In addition, as means for supporting a reticle from its periphery so as not to be shifted in a horizontal direction, the stopper pins for preventing a horizontal movement are provided. Moreover, as means for supporting a reticle from above, a reticle retainer is provided. These means support and fix the reticle in X, Y and Z directions.

In general, kinematic pin grooves are provided on the underside of the reticle-carrying container and are engaged with the kinematic pins of a light exposure apparatus, which allows the reticle-carrying container to be positioned with accuracy. These kinematic pin grooves and kinematic pins are arranged in a set of three, one each at the apexes of an approximately isosceles triangle.

However, if the above mentioned conventional reticle-carrying container 3 is turned 180-degrees by mistake in the reticle stocker 2, the kinematic pins and the kinematic pin grooves are opposed and are not properly mated with one another, and thus the reticle-carrying container 3 cannot be fastened. Accordingly, much attention to the orientation of the reticle-carrying container 3 is required, which leads to impairment of working efficiency.

SUMMARY OF THE INVENTION

In order to solve the above stated problem, the present invention permits a wrong orientation of the reticle-carrying container thereby improving working efficiency. More specifically, the present invention relates to a reticle-carrying container that has an interior with an opening at one end for storing the reticle, and that includes a door for covering and blocking the opening and a seal material for sealing the interior hermetically when the door closes the pod. The reticle-carrying container is provided, on the outer surface of the door, with two sets of kinematic pin grooves for positioning and fastening the reticle-carrying container, which sets have orientations turned 180-degrees from each other.

This allows the reticle-carrying container to be fastened as is into the reticle stocker even if the reticle-carrying container is wrongly oriented, which eliminates the need to be excessively careful about the orientation of the reticle-carrying container.

It is preferable to arrange receiving parts for receiving and holding the kinematic pin grooves in the positions corresponding to the kinematic pin grooves on the outer surface of the pod, so that the two sets of kinematic pin grooves can be engaged with the pins in both orientations.

This makes it possible to stack a plurality of reticle-carrying containers without paying excessive attention to their orientations.

DESCRIPTION OF THE PREFERRED EMBODIMENTS

Figure 3:
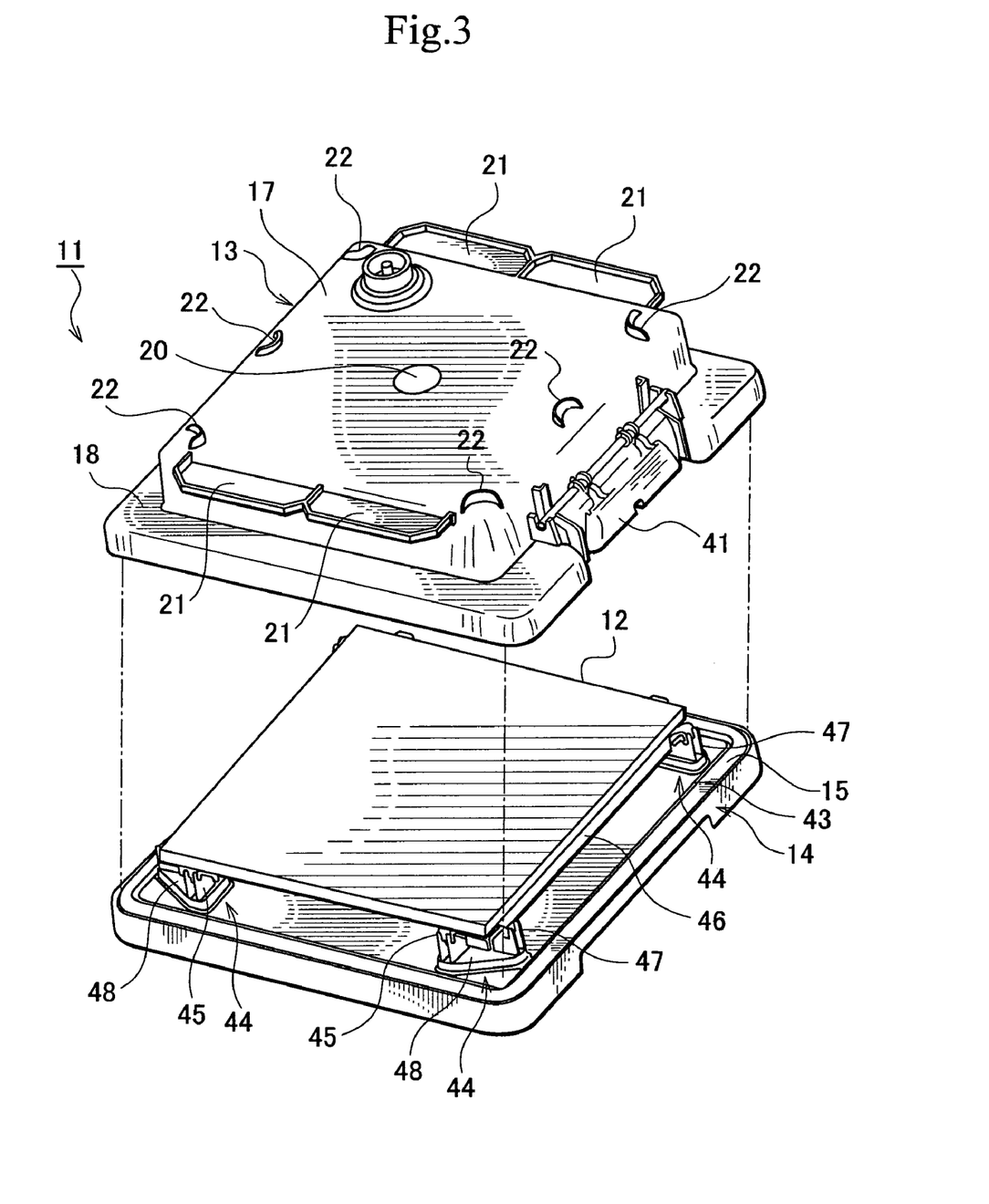
FIG. 3 is an exploded perspective view showing a reticle-carrying container according to the embodiment of FIG. 1 in which a pod and the door are separated from each other.
Figure 4:
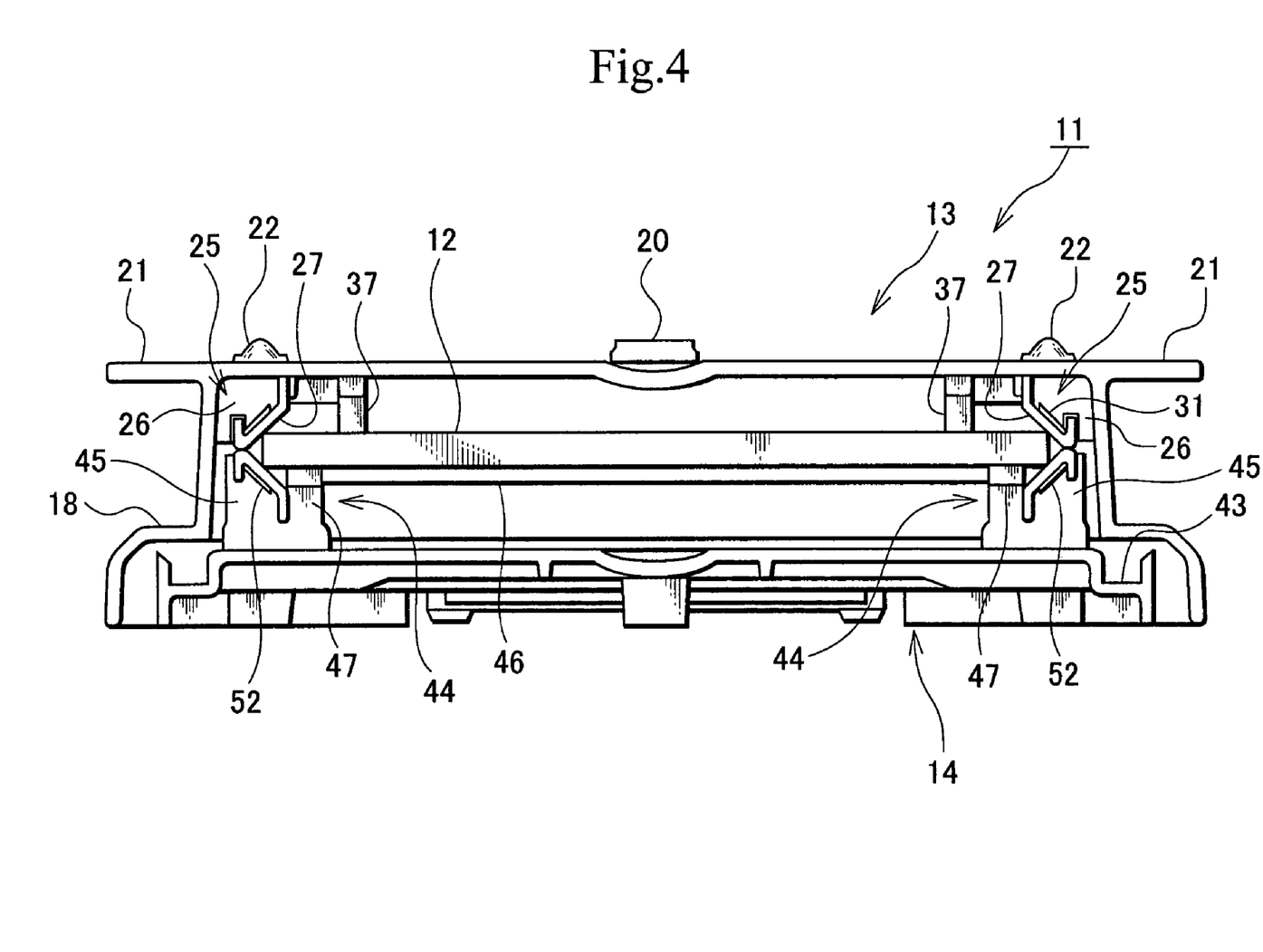
FIG. 4 is a side cross sectional view showing the reticle-carrying container according to the embodiment of FIG. 1.

A preferred embodiment of the present invention is described below with reference of the accompanied drawings. As shown in FIGS. 3 and 4, a reticle-carrying container 11 is mainly composed of a pod 13 for storing a reticle 12, a door 14 for closing the pod 13, and a seal material 15 provided between the pod 13 and the door 14, for sealing the interior hermetically.

The pod 13 is composed of a main part 17 for storing the reticle 12 in the interior and a peripheral edge engagement part 18 that is formed integrally with the outer circumference of the main part 17 and engages with the door 14.

The main part 17 is formed in the shape of a dish and configured to have a depth allowing the reticle 12 to be completely stored in the interior. A center handling flange 20 for reticle transfer is provided in the center of the main part 17. Horizontally extending plate-shaped side handling flanges 21 extended from the peripheral edge of the main part 17. The center handling flange 20 is coupled with an arm (not shown) of the transfer mechanism to lift the reticle-carrying container 11 and the pod 13. In addition, the side handling flange 21 is used as an auxiliary supporting means in separating the door 14 mechanically from the pod 13 within the light exposure apparatus. Moreover, provided near the peripheral edge of the outer surface of the main part 17 are receiving parts 22 for receiving kinematic pin grooves 61 described later, three each on one side and total six on the two opposed sides. The six receiving parts 22 are arranged in the positions corresponding to the kinematic pin grooves 61 so that the two sets of kinematic pin grooves 61 can be engaged with the pins in both orientations. Each of the receiving parts 22 is formed of a plate with a semicircular flat plane. Also, each of the receiving parts 22 with a semicircular flat plane is arranged so that its opening faces outward. In addition, the receiving parts 22 with a semicircular flat plane are formed with a slight inward inclination in such a manner that their front ends become closer to one another than their base ends. This allows the upper kinematic pin grooves 61 of the reticle-carrying container 11 to engage easily with the lower receiving parts 22 of the reticle-carrying container 11, thereby positioning the reticle-carrying container 11 accurately. Therefore, it is possible to stack a plurality of reticle-carrying containers 11 in an easy and stable manner. As a matter of course, the receiving parts may be of any shape other than semicircular, provided that receiving parts receive properly the kinematic pin grooves.

Figure 5:
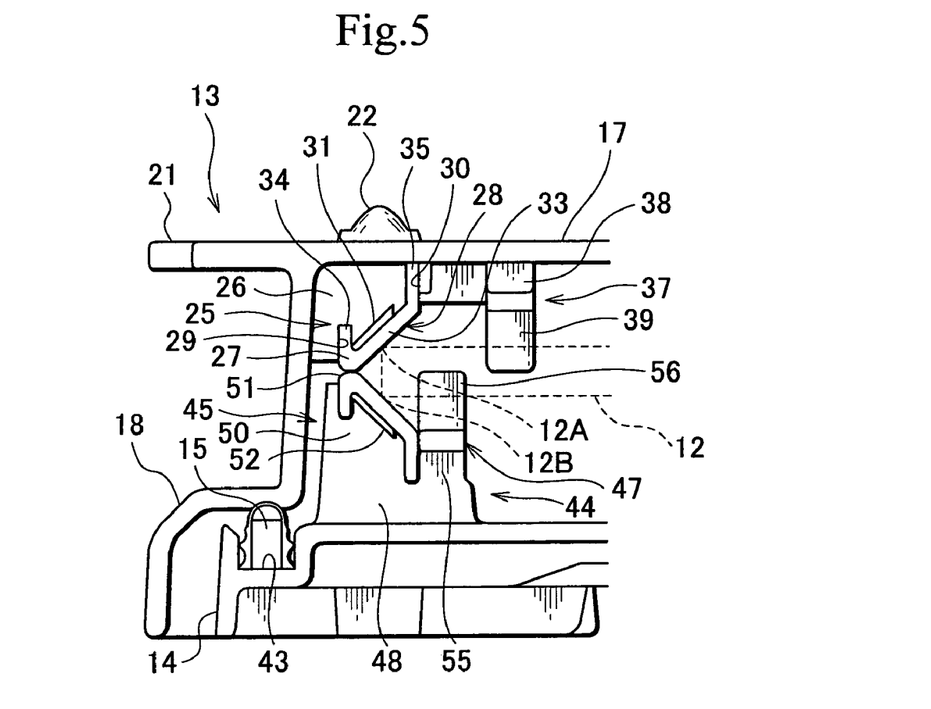
FIG. 5 is a cross sectional view showing the major components of the reticle-carrying container according to the embodiment of FIG. 1.

Reticle retainers 25 are provided in the vicinities of the four corners inside the main part 17. The reticle retainer 25 is a member for supporting the reticle 12 in cooperation with a reticle retainer 45 described later on the door 14. As shown in FIGS. 4 and 5, the reticle retainer 25 is composed of a retainer receiving part 26 and a retainer plate 27. The retainer receiving part 26 is a member for supporting the retainer plate 27. The retainer receiving parts 26 are formed integrally with the main part 17 in the vicinities of the four corners inside the main part 17. More specifically, the retainer receiving part 26 is a pentagonal plate formed on a corner of the main part 17, and one of the sides of the plate material constitutes an inclined plane 28 that contacts with an upper corner 12A of the reticle 12 and supports the reticle elastically. One end of the side of the retainer receiving part 26 that forms the inclined plane 28 is provided with a one-end engagement notch 29 that engages with one end of the retainer plane 27. The other end of the side of the retainer receiving part 26 that forms the inclined plane 28 is provided with an other-end engagement notch 30 that engages with the other end of the retainer plate 27. Besides, a concave portion 31 is provided on the side forming the inclined plane 28. The concave portion 31 is provided inside the inclined plane 28 and allows the deformation of the inclined plane 28 at the time of contact with the upper corner 12A of the reticle 12. The concave portion 31 provides the retainer plate 27 with a shock-absorbing function. That is, the retainer plate 27 becomes elastically deformed with the elasticity of the retainer plate 27 itself and also by the action of the concave portion 31, absorbs the vibrations, etc. from outside and supports the reticle 12 elastically. A gap of about 1 mm between the concave portion 31 and the retainer plate 27 is acceptable.

The retainer plate 27 is a member that forms the inclined plane 28 for contacting with the upper corner 12A of the reticle 12 and supporting the reticle 12 elastically. The retainer plate 27 is molded of elastic macro molecule material. To be more specific, the retainer plate 27 is made of elastic material generating no dust, such as PEE (polyester elastomer), PBT (polybutylene terephthalate) and PP (polypropylene). The retainer plate 27 is composed of a contact surface plate 33, a one-end engagement part 34 and an other-end engagement part 35, and its side is formed in an irregular U shape. The contact surface plate 33 is a member providing the inclined plane 28 with the retainer plate 27 engaged with the retainer receiving part 26.

The contact surface plate 33 is molded of elastic synthetic resin, and thus elastically deforms on its own and also is elastically bent by the action of the above mentioned concave portion 31. This allows the contact surface plate 33 to contact the upper corner 12A of the reticle 12 obliquely and support the reticle 12 elastically.

The one-end engagement part 34 is a member that engages with the one-end engagement notch 29 of the retainer receiving part 26 to attach the retainer plate 27 to the retainer receiving part 26. The other-end engagement part 35 is a part that engages with the other-end engagement notch 30 of the retainer receiving part 26 to attach the retainer plate 27 to the retainer receiving part 26. Accordingly, the one-end engagement part 34 and the other-end engagement part 35 engage with the one-end engagement notch 29 and the other-end engagement notch 30, respectively, which allows the retainer plate 27 to be fixed to the retainer receiving part 26.

In addition to the reticle retainers 25, pellicle retainers 37 are provided in the vicinities of the four corners inside the main part 17. The reticle 12 may be not provided with the pellicle, may be provided with the pellicle 46 on its bottom, or may be provided with the pellicle 46 on its top and bottom. The pellicle retainer 37 is a member that works with the pellicle provided on the top of the reticle 12. The pellicle retainer 37 has the same structure as that of the reticle retainer 25. More specifically, the pellicle retainer 37 is composed of a retainer receiving part 38 having the same structure as that of the retainer receiving part 26 of the reticle retainer 25 and a retainer plate 39 having the same structure as that of the retainer plate 27 of the reticle retainer 25. A concave portion (not shown) having the same structure as that of the concave portion 31 of the reticle retainer 25 is provided inside the retainer plate 39.

As shown in FIGS. 3 and 4, the peripheral edge engagement part 18 of the pod 13 is formed in the shape of a dish in such a manner as to protrude circumferentially from the peripheral edge of the main part 17. The dish-shaped peripheral edge engagement part 18 is configured to have a depth allowing the door 14 to be completely stored in its interior. The opposed sides of the peripheral edge engagement part 18 are provided with fasteners 41 for holding down the door 14.

The door 14 is a member that engages with the peripheral edge engagement part 18 of the pod 13 to close the pod 13 and seal the interior hermetically via the seal material 15. As shown in FIG. 3 to FIG. 5, the door 14 is formed in an approximately flat shape and is provided with a seal groove 43 around its peripheral edge. The seal material 15 is attached to the seal groove 43 so as to hermetically seal the gap between the pod 13 and the door 14. Door-side support members 44 are provided on the four corners on the top of the door 14. The door-side supporting member 44 is composed of a reticle retainer 45 for supporting the reticle from both the top and bottom in coordination with the reticle retainer 25 on the side of the pod 13, a pellicle retainer 47 for supporting the pellicle 46 attached to the bottom of the reticle 12, and a base plate 48 for supporting the above mentioned components integrally. The reticle retainer 45 is structured in such a manner that a retainer receiving part 50 is shifted in a direction perpendicular to the plane of FIG. 5 from the retainer receiving part 27 of the reticle retainer 25 on the side of the pod 13, thereby displaying mirror symmetry. To be more specific, the reticle retainer 45 is composed of the retainer receiving part 50 and a retainer plate 51, and these components are configured so as to be mirror symmetrical with respect to the retainer receiving part 26 and the retainer plate 27 of the reticle retainer 25, respectively. A concave portion 52 inside the retainer plate 51 also has the same functions as those of the concave portion 31 of the reticle retainer 25. More specifically, the retainer plate 51 is elastically bent by the action of the concave portion 52 so as to contact the lower corner 12B of the reticle 12 obliquely and support elastically the reticle 12.

The above mentioned reticle retainer 45 and the reticle retainer 25 are located so as to shift from each other and support the reticle 12 without interference with each other. The reticle 12 is held and supported in a predetermined position between these reticle retainers 25 and 45. Even if the pod 13 is removed, the reticle 12 is continuously supported by the reticle retainer 45 of the door 14, at a predetermined distance from the door 14. A pellicle receiving part 56 of the pellicle retainer 47 is shifted in a direction transverse with respect to the plane of FIG. 5 from the retainer receiving part 39 of the pellicle retainer 37 on the side of the pod 13, thereby displaying mirror symmetry. More specifically, the pellicle retainer 47 is composed of a retainer receiving part 55 that is mirror symmetrical with the retainer receiving part 38 of the pellicle retainer 37 on the side of the pod 13 and a retainer plate 56 that is mirror symmetrical with the retainer plate 39. A concave portion (not shown) having the same structure as that of the concave portion of the pellicle retainer 37 is provided inside the retainer plate 56.

Figure 1A:
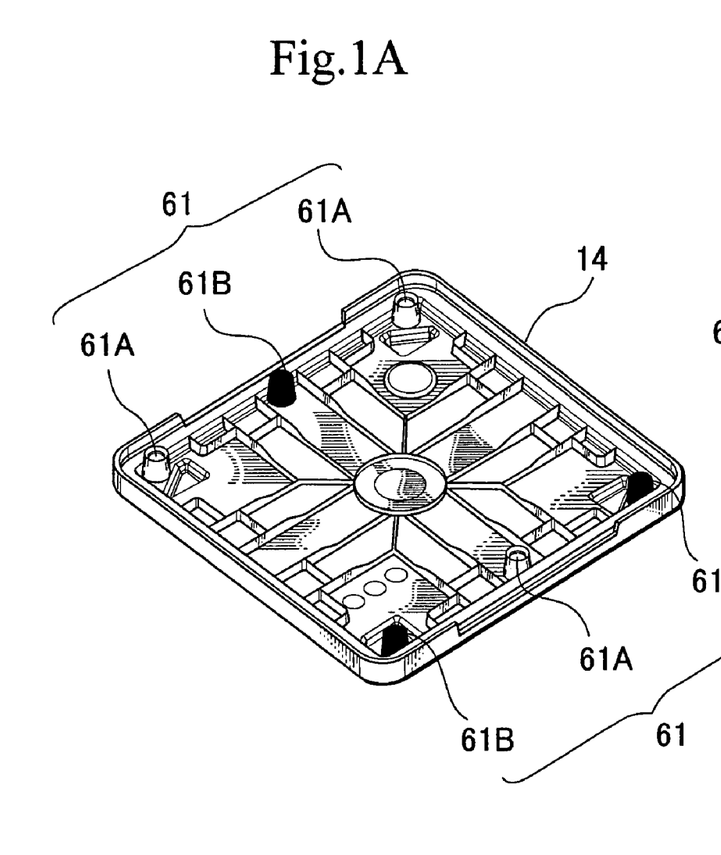
FIG. 1 is a perspective view of a door according to an embodiment of the present invention as seen from its bottom.
Figure 1B:
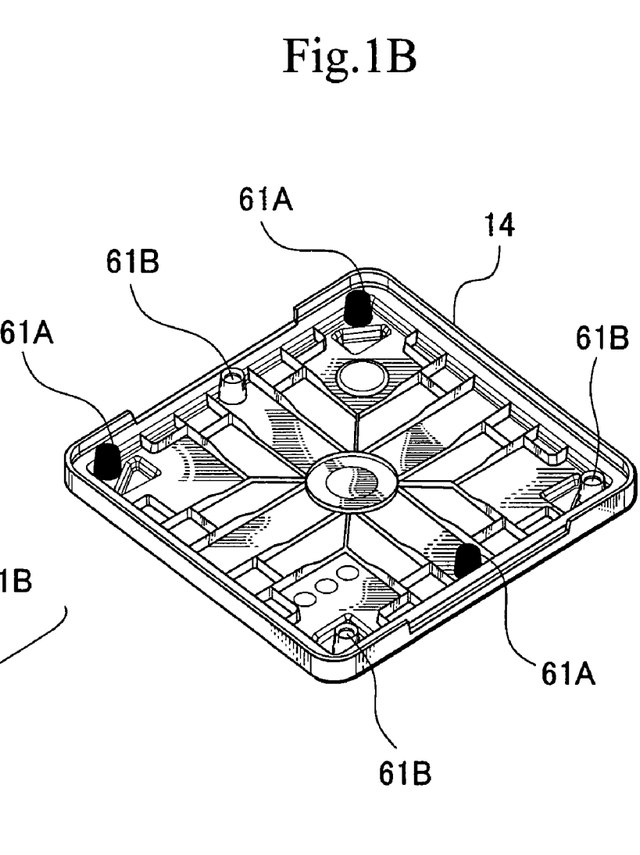

As shown in FIG. 1, two sets of kinematic pin grooves 61 are arranged on the back of the door 14. The kinematic pin groove 61 is a protrusion with a recess in its distal end for positioning and attaching the door 14 to the light exposure apparatus. A total of six kinematic pin grooves 61, three each at the apexes of an approximately isosceles triangle, are provided in two sets (61A and 61B) turned 180-degrees from each other. Thus, even if the operator has attached the reticle-carrying container 11 to the light exposure apparatus in a 180-degree-turned orientation by mistake, these pin grooves allow the reticle-carrying container 11 to be fit into the apparatus.

Figure 6:
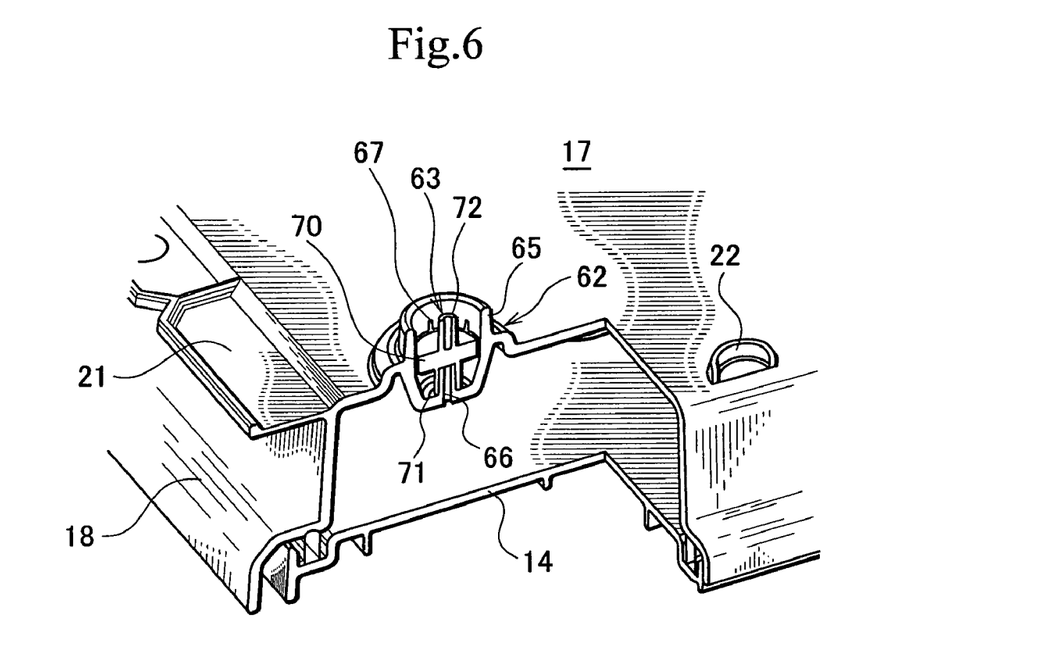
FIG. 6 is a cross sectional view of major components of a membrane filter according to the embodiment of FIG. 1.

As illustrated in FIG. 6, a membrane filter attachment part 62 is formed in the pod 13. The membrane filter attachment part 62 is a part for allowing the membrane filter 63 to be securely attached and easily removed. The membrane filter attachment part 62 is composed of a tube guide 65, a filter engagement pipe 66 and a stopper 67.

The tube guide 65 is a part for storing and fixing the membrane filter 63 in the interior. The tube guide 65 is arranged integrally with the main part 17 of the pod 13. The outside of the tube guide 65 has an opening through which the membrane filter 63 is attached or removed. Moreover, the tube guide 65 also works as a tube for connection with a gas supply tube (not shown) for changing gases in the reticle-carrying container 11. The inside of the tube guide 65 is covered and provided with the filter engagement pipe 66. The filter engagement pipe 66 is a part for engagement with an engagement pipe 71 of the membrane filter 63. The filter engagement pipe 66 is structured in the tube guide 65, as a small-diameter pipe protruding outward from the inside bottom of the tube guide 65. The stopper 67 is provided in the center of the inside surface of the tube guide 65. The stopper 67 is a member for fixing the membrane filter 63 to the tube guide 65.

The membrane filter 63 is a filter that allows the passage of a gas between the inside and outside of the reticle-carrying container 11. The membrane filter 63 prevents the entry of dust, etc. and allows only a gas to pass between the inside and outside of the reticle-carrying container 11. The membrane filter 63 is composed of a filter main part 70, an engagement pipe 71 and an opening pipe 72.

The filter main part 70 is formed in the shape of a thick-walled disc and stores a filter in its interior. The filter main part 70 has a diameter so as to be locked on the stopper 67. The engagement pipe 71 is a member for allowing inside of the filter main part 70 to communicate with the inside of the reticle-carrying container 11. When the membrane filter 63 is attached in the tube guide 65, the engagement pipe 71 engages with the filter engagement pipe 66, thereby making the filter main part 70 communicate with the inside of the reticle-carrying container 11. The opening pipe 72 is a part for making the inside of the reticle-carrying container 11 communicate with outside via a filter. As such a filter, a 0.1- to 0.5-μm mesh is used so as to eliminate inert gases and dust elements in dry air.

Figure 7:
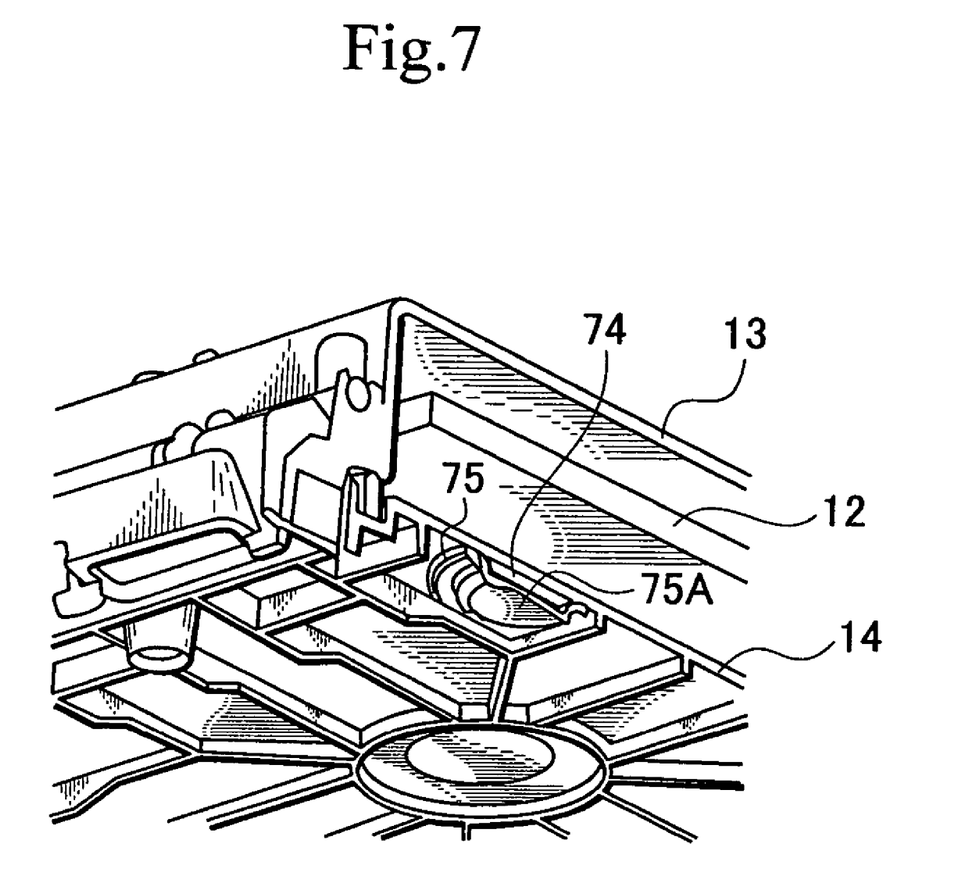
FIG. 7 is a cross sectional view of major components of a wireless tag according to the embodiment of FIG. 1.

As illustrated in FIG. 7, a wireless tag 74 is provided on the outer surface of the door 14. The wireless tag 74 is covered with a covering plate 75 and attached to the outer surface of the door 14. When covering the wireless tag 74 completely, the covering plate 75 is welded at its circumference and thus the interior is sealed. A concave portion 75A for storing the wireless tag 74 is formed in the covering plate 75. When the wireless tag 74 is stored in the concave portion 75A of the covering plate 75, the covering plate 75 is welded at its circumference to the outer surface of the door 14. This allows the wireless tag 74 to be hermetically stored in the covering plate 75, the purpose of which is to prevent the wireless tag 74 from falling off or suffering mechanical damage during transport of the reticle-carrying container 11. In addition, there is also the purpose of avoiding contamination of the light exposure apparatus with the wireless tag itself. The wireless tag 74 is a device that allows the writing and reading of information in a non-contact manner electromagnetically from outside. The wireless tag 74 holds various types of management information required for operations and storage.

The reticle-carrying container 11 configured in this manner is used as described below. Here, the description is given taking as an example a case where the reticle-carrying container 11 is used in printing a circuit pattern on a semiconductor wafer.

Firstly, the reticle 12 is stored in the reticle-carrying container 11. At that time, the reticle 12 is placed on the reticle retainer 45 of the door 14, and then the pod 13 is mounted and fixed with the fasteners 41. This allows the reticle 12 to be supported between the reticle retainer 45 on the side of the door 14 and the reticle retainer 25 of the pod 13. More specifically, the retainer plate 51 of the reticle retainer 45 and the retainer plate 27 of the reticle retainer 25 contact obliquely and support the lower corner 12B of the reticle 12 and the upper corner 12A of the reticle 12, respectively. At that time, concave portions 52 and 31 inside the retainer plates 51 and 27 allow the deformation of the retainer plates 51 and 27, thereby supporting the reticle 12 elastically. This allows the reticle 12 to be restrained in all the degrees of freedom and fixed within the reticle-carrying container 11, without suffering any damage to its surface.

If the reticle 12 is provided with the pellicle 46, the pellicle 46 is fixed with the pellicle retainer 47 in the same way as the reticle 12.

In this manner, the reticles 12 are stored one by one in the reticle-carrying containers 11. The operator stacks a required number of reticle-carrying containers in the reticle stocker 2. At that time, it is preferable to align all the reticle-carrying containers 11 in the predetermined orientation. However, even if any of the reticle-carrying containers 11 is wrongly oriented, it can be fastened without problems by the two sets of kinematic pin grooves 61. To be more specific, even if any of the reticle-carrying containers 11 is oriented turned 180-degrees, one of the two sets of kinematic pin grooves 61 will engage with the kinematic pins of the reticle stocker 2, which allows the reticle-carrying container 11 to be fastened. Additionally, in stacking a plurality of reticle-carrying containers, the receiving parts 22 in the six positions corresponding to the kinematic pin grooves 61 receive and engage with the kinematic pin grooves 61 regardless of the orientations of the reticle-carrying containers 11. This allows the reticle-carrying containers 11 to be accurately positioned and stably stacked. Therefore, the operator can set the reticle-carrying containers 11 in the reticle stocker 2 without excessive care.

All the subsequent operations in relation to the reticle-carrying container 11, such as transportation, are performed in a mechanical fashion. More specifically, all the operations including taking the reticle-carrying container 11 out of the reticle stocker 2, putting it into storage, moving it on the transfer rail by means of the transfer crane, and setting the reticle 12 in the reticle-carrying container 11 to the light exposure apparatus 1, are mechanically carried out (SMIF: Standard Mechanical Interface).

The transfer mechanism 5 of the transfer rail 4 lifts the reticle-carrying container 11 with a binding between the reticle-carrying container 11 in the reticle stocker 2 and the center handling flange 20. Then, the reticle-carrying container 11 is moved along the transfer rail 4 to the light exposure apparatus 1.

Next, the reticle-carrying container 11 is introduced into the light exposure apparatus 1. After that, the reticle 12 is moved toward the automatic exposure stage (not shown) of the light exposure apparatus 1, positioned accurately in a predetermined position on the already set semiconductor wafer, and light-exposed in an automatic manner.

Upon completion of the light exposure, the reticle 12 is restored to the reticle-carrying container 11. Then, the reticle-carrying container 11 is moved on the transfer rail 4 and put back to the reticle stocker 2 by the transfer mechanism 5.

These operation processes are controlled on the basis of the information recorded in the wireless tag 74. The wireless tag 74 on the door 14 of the reticle-carrying container 11 stores various types of information including the kind of the reticle 12 and the operation histories. The reader (not shown) of the light exposure apparatus 1 reads the information from the wireless tag 74 in a non-contact manner and the light exposure apparatus 1 exercises control according to the information. After completion of the light exposure, if required, the light exposure apparatus 1 uses the writer (not shown) to write the history records and operation records of the reticle 12 and the reticle-carrying container 11 into the wireless tag 74. This allows exposure and management operations to be smoothly carried out.

Since the wireless tag 74 is hermetically sealed by the covering plate 75, it is possible to prevent the wireless tag 74 from falling off and suffering mechanical damage and to avoid contamination of the light exposure apparatus by the wireless tag 74 itself.

Suppose that the reticle-carrying container 11 is located in an environment with changes in atmospheric pressure. For example, if the reticle-carrying container 11 is placed under a relatively low atmospheric pressure in the sky, as in the case of air transport, or placed under a relatively high atmospheric pressure on the ground, the pressure in the reticle-carrying container 11 may be lower than the outside pressure. In this case, it is difficult to separate the pod 13 from the door 14. On this account, the membrane filter 63 allows the passage of a gas between the inside and outside of the reticle-carrying container 11, which prevents a pressure in the reticle-carrying container 11 from being higher than the external pressure. This makes it easy to separate the pod 13 from the door 14.

In addition, in changing the gas in the reticle-carrying container 11, a gas supply tube is inserted into and connected with the tube guide 65 of the membrane attachment part 62 to send an inert gas or dry air into the tube guide 65.

As stated above, two sets of kinematic pin grooves 61 are provided turned 180-degrees from each other. Thus, even if the reticle-carrying container 11 is set in the wrong orientation, the kinematic pin grooves 61 permit the reticle-carrying container 11 to be fastened without problems. Therefore, the operator can set the reticle-carrying container 11 in the reticle stocker 2 without exercising extra care, thereby improving the working efficiency.

In other words, even if the operator has placed the reticle-carrying container 11 in the reticle stocker 2 with its orientation turned 180 degrees, the two sets of kinematic pin grooves 61 turned 180-degrees from each other permit the reticle-carrying container 11 to be fastened. This makes it possible to stack the reticle-carrying containers 11 without extra care for their orientation, which increases the efficiency of setting the reticle-carrying container 11.

Moreover, the receiving parts 22 are provided on the main part 17 of the pod 13 in the six positions corresponding to the kinematic pin grooves 61, which makes it possible to stack a plurality of reticle-carrying containers 11 without any concern about their orientations, resulting in improvement of working efficiency. Thus, the operator can increase the efficiency of his/her labor without extra care.

That is, the receiving parts 22 are arranged in such a manner that the two sets of kinematic pin grooves 61 can engage the pins in both orientations, which makes it possible to stack a plurality of reticle-carrying containers 11 without paying excessive attention to their orientations. This achieves an increase in the efficiency of setting the reticle-carrying containers 11. Besides, this allows the reticle 12, etc. to be supported safely and securely without any damage from the reticle retainer 25, etc., making it possible to treat the reticle 12, etc. more carefully.

Additionally, varied types of information are recorded and managed in the wireless tag 74, which makes it possible to increase operating efficiency based on that information. The wireless tag 74 is hermetically sealed by the covering plate 75, and thus it is possible to prevent the wireless tag 74 from falling off and suffering mechanical damage and to avoid contamination of the light exposure apparatus by the wireless tag 74 itself.

Moreover, the membrane filter 63 allows the passage of a gas between the inside and outside of the reticle-carrying container 11, which prevents pressure in the reticle-carrying container 11 from becoming higher than the external pressure. This makes it easy to separate the pod 13 from the door 14. In addition, this also makes it easy to change the gas in the reticle-carrying container 11.

In the above mentioned embodiment, the membrane filter 63 is provided on the side of the pod 13. Alternatively, this may be provided on the side of the door 14. In addition, the number of the membrane filter 63 is not limited to one and may be two or more. One or a plurality of the membrane filters 63 may be provided in either the pod 13 or the door 14 or both. In this case, the membrane filters 63 must be installed in positions that do not interfere with the other components.

Furthermore, in the above described embodiment, one wireless tag 74 is attached to the outer surface of the door 14. Alternatively, as required, two or more wireless tags may be provided. Also, the position of the attachment is not limited to the door 14 and may be the pod 13 or both. Depending on the required function or the relationship between the reader and the writer, the wireless tag 74 may be attached to the side of the pod 13. In addition, the information to be recorded in the wireless tag 74 is not limited to operation histories and may be other various kinds of information.

What is claimed is:

1. A reticle-carrying container comprising:
   a pod having an interior opening at one side for storing a reticle;
   a door for covering the opening; and
   a seal material for sealing the interior hermetically when the door is in place covering the opening of the pod;
   wherein two sets of kinematic pin grooves, for positioning and fastening the reticle-carrying containers are provided on the outer surface of the door;
   wherein one of the sets of the kinematic pin grooves consists of three pin grooves respectively arranged at the three apexes of an approximately isosceles triangle in a first orientation and the other of the sets of kinematic pin grooves consists of three pin grooves respectively arranged at the three apexes of the approximately isosceles triangle turned 180 degrees from the first orientation to a second orientation.

2. The reticle-carrying container according to claim 1, wherein receiving parts for receiving and holding the kinematic pin grooves are arranged, in positions corresponding to positions of the kinematic pin grooves on the outer surface of the pod, so that the two sets of kinematic pin grooves can be engaged with the receiving parts on the outer surface of another pod in the first orientation and in the second orientation.

3. The reticle-carrying container according to claim 1, wherein the pin grooves are protrusions extending from the outer surface of the door to distal ends having recesses therein.

* * * * *